(12) United States Patent
Zhou et al.

(10) Patent No.: US 9,159,867 B2
(45) Date of Patent: Oct. 13, 2015

(54) ARRAY SUBSTRATE, MANUFACTURING METHOD THEREOF, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Bozhu Zhou, Beijing (CN); Mingji Bai, Beijing (CN); Binbin Cao, Beijing (CN); Na Zhao, Beijing (CN); Wenlong Wang, Beijing (CN); Yijun Wang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/021,314

(22) Filed: Sep. 9, 2013

(65) Prior Publication Data

US 2014/0070240 A1 Mar. 13, 2014

(30) Foreign Application Priority Data

Sep. 10, 2012 (CN) .......................... 2012 1 0333280

(51) Int. Cl.
*H01L 33/00* (2010.01)
*H01L 29/45* (2006.01)
*H01L 27/12* (2006.01)

(52) U.S. Cl.
CPC .......... *H01L 33/0041* (2013.01); *H01L 27/124* (2013.01); *H01L 29/458* (2013.01)

(58) Field of Classification Search
CPC .................................................... H01L 33/0041
See application file for complete search history.

(56) References Cited

U.S. PATENT DOCUMENTS

| | | | | |
|---|---|---|---|---|
| 2005/0148143 A1* | 7/2005 | Yang et al. | ..... | 438/283 |
| 2008/0276957 A1* | 11/2008 | Nogami | ..... | 134/1.1 |
| 2010/0117078 A1* | 5/2010 | Kuwabara et al. | ..... | 257/43 |
| 2012/0309136 A1 | 12/2012 | Zhou et al. | | |

FOREIGN PATENT DOCUMENTS

| | | |
|---|---|---|
| CN | 101826532 A | 9/2010 |
| CN | 102655095 A | 9/2012 |

OTHER PUBLICATIONS

First Chinese Office Action dated Jul. 30, 2014; Appln. No. 201210333280.9.
Second Chinese Office Action dated Apr. 3, 2015, Appln. No. 201210333280.9.

* cited by examiner

*Primary Examiner* — Matthew Reames
(74) *Attorney, Agent, or Firm* — Ladas & Parry LLP

(57) ABSTRACT

Embodiments of the invention provide an array substrate, a manufacturing method thereof and a display device. The array substrate comprises: a base substrate; a gate line and a gate electrode formed on the base substrate; a gate insulating layer formed on the gate line and the gate electrode; a source electrode, a drain electrode and a pixel electrode formed on the gate insulating layer, wherein the pixel electrode is directly connected to the drain electrode; and an active layer formed on the gate insulating layer, the source electrode and the drain electrode.

5 Claims, 4 Drawing Sheets

ARRAY SUBSTRATE, MANUFACTURING METHOD THEREOF, AND DISPLAY DEVICE

TECHNICAL FIELD

Embodiments of the invention relate to an array substrate, a manufacturing method thereof and a display device.

BACKGROUND

With reference to FIGS. 1 and 2, an array substrate of a conventional TFT-LCD (Thin Film Transistor-Liquid Crystal Display) comprises: a gate line 11' and a gate electrode 2' formed on the base substrate 1'; a gate insulating layer 3' formed on the gate line 11' and the gate electrode 2'; an active layer 7', a source electrode 4' and a drain electrode 5' formed on the gate insulating layer 3'; a passivation layer 8' formed on the active layer 7', the source electrode 4' and the drain electrode 5'; a through hole 9' formed in the passivation layer 8'; and a pixel electrode 6' formed on the passivation layer 8'. The pixel electrode 6' is connected to the drain electrode 5' via the through hole 9'. This array substrate is widely adopted due to its good controllability and the like.

However, this array substrate has the following problems. The through hole 9' for connecting the pixel electrode 6' and the drain electrode 5' is within the pixel region of the array substrate, and the region for the through hole 9' is opaque. Thereby, the aperture ratio of the array substrate is adversely influenced.

In the thin film transistor with top gate structure, the active layer may be undesirably irradiated by the light from a backlight. Accordingly, the thin film transistor with bottom gate structure is generally adopted in the array substrate. In the thin film transistor with the bottom gate structure, the source and the drain electrodes and the gate electrode are disposed on opposing sides of the active layer, as shown in FIG. 2. When the gate electrode 2' is switched on, a current passage C' is formed on the bottom side of the active layer 7' so that the current passage C' and the source and drain electrodes are separated by a region corresponding to the thickness of the active layer 7. Since the conductivity of the active layer 7' is relatively low, the properties of the TFT may be reduced in the case that the current passes through the region separating the current passage C' and the source and drain electrodes.

SUMMARY

According to an aspect of the invention, an array substrate is provided. The array substrate comprises:
a base substrate;
a gate line and a gate electrode formed on the base substrate;
a gate insulating layer formed on the gate line and the gate electrode;
a source electrode, a drain electrode and a pixel electrode formed on the gate insulating layer, wherein the pixel electrode is directly connected to the drain electrode; and
an active layer formed on the gate insulating layer, the source electrode and the drain electrode.

For example, each of the source electrode and the drain electrode comprises at least two conductive layers.

For example, each of the source electrode and the drain electrode comprises a transparent electrode layer and a metal layer provided on the transparent electrode layer, the pixel electrode and the transparent electrode layer are formed integrally.

For example, the array substrate further comprises:
a passivation layer formed on the source electrode, the drain electrode and the active layer, wherein a through hole is formed in the passivation layer; and
a data line formed on the passivation layer, wherein the data line is connected to the source electrode via the through hole.

For example, the array substrate further comprises: an ohmic contact layer which is formed between the source electrode and the active layer as well as between the drain electrode and the active layer.

According to another aspect of the invention, a manufacturing method of an array substrate is provided. The method comprises:
forming a gate line and a gate electrode on a base substrate;
forming a gate insulating layer on the gate line and the gate electrode;
forming a conductive layer on the gate insulating layer, and performing a patterning process on the conductive layer to form a drain electrode, a source electrode and a pixel electrode, wherein the pixel electrode is directly connected to the drain electrode; and
forming an active layer on the gate insulating layer, the source electrode and the drain electrode.

For example, the step of forming the drain electrode, the source electrode and the pixel electrode comprises: sequentially forming at least two conductive layers on the gate insulating layer, and performing a patterning process on the at least two conductive layers to form the source electrode, the drain electrode and the pixel electrode.

For example, the step of forming the drain electrode, the source electrode and the pixel electrode comprises: sequentially forming two conductive layers on the gate insulating layer, and performing a patterning process on the two conductive layers to form the source electrode, the drain electrode and the pixel electrode. The two conductive layers are a transparent electrode layer and a metal layer provided on the transparent electrode layer, each of the source electrode and the drain electrode is formed by the transparent electrode layer and the metal layer, and the pixel electrode is merely formed by the transparent electrode layer.

For example, the method further comprises:
forming a passivation layer on the source electrode, the drain electrode and the active layer;
forming a through hole in the passivation layer;
forming a data line on the passivation layer, wherein the data line is connected to the source electrode via the through hole.

For example, the method further comprises: forming an ohmic contact layer between the source electrode and the active layer as well as between the drain electrode and the active layer.

According to still another aspect of the invention, a display device is provided. The display device comprises the above-mentioned array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION OF THE PREFERRED EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
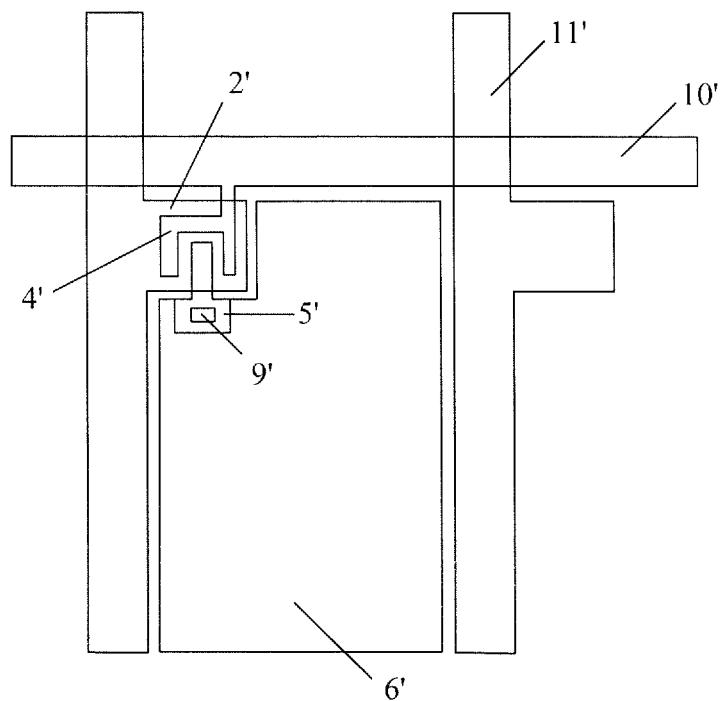
FIG. 1 is a plane view illustrating a conventional array substrate.
Figure 2:
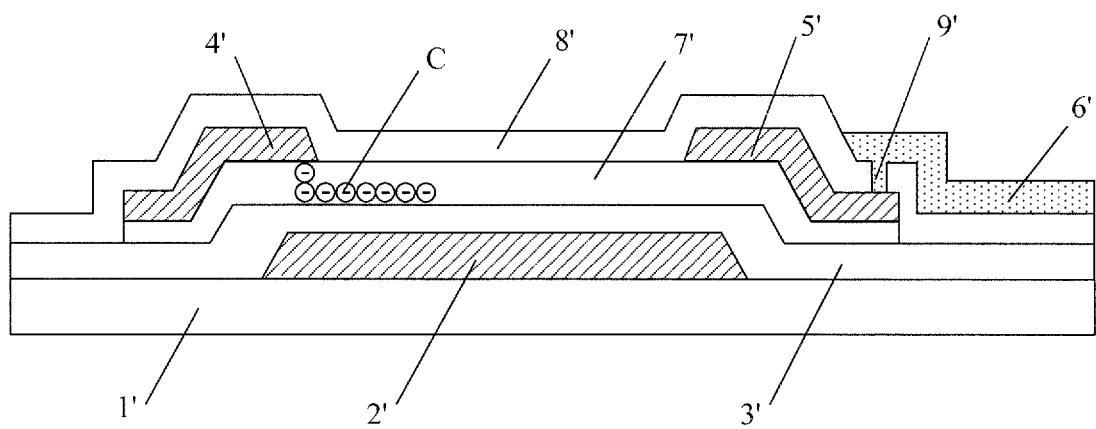
FIG. 2 is a sectional view illustrating the conventional array substrate.
Figure 3:
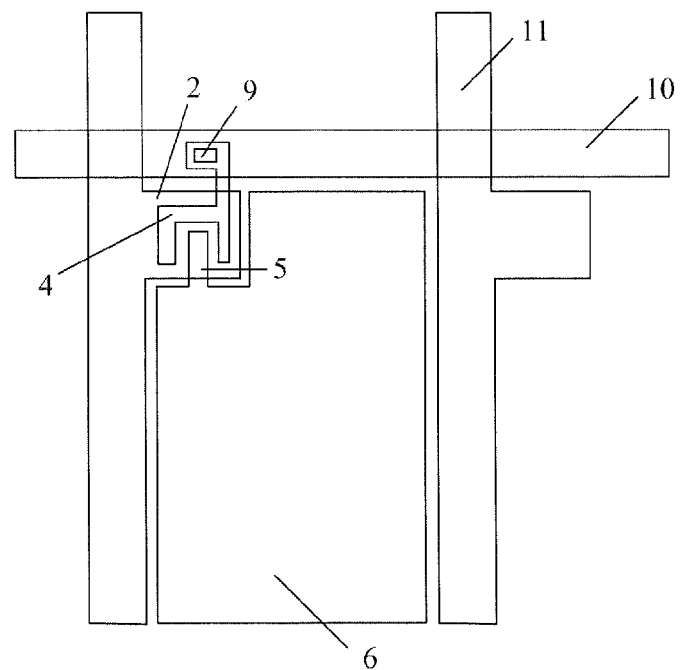
FIG. 3 is a plane view illustrating an array substrate according to the an embodiment of the invention.
Figure 4:
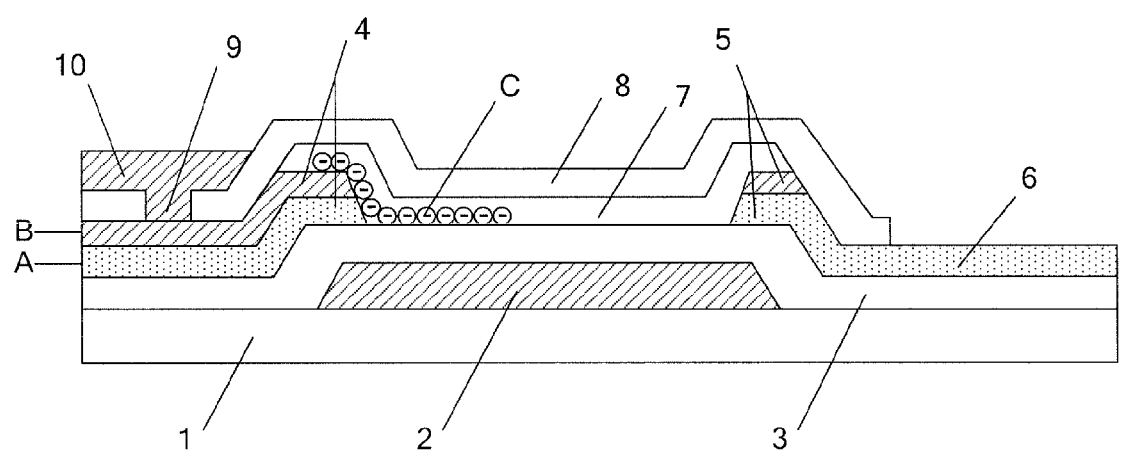
FIG. 4 is a sectional view illustrating the array substrate according to the embodiment of the invention.

With reference to FIGS. 3 and 4, an array substrate according to an embodiment of the invention comprises:
- a base substrate 1;
- a gate line 11 and a gate electrode 2 formed on the base substrate 1;
- a gate insulating layer 3 formed on the gate line 11 and the gate electrode 2;
- a source electrode 4, a drain electrode 5 and a pixel electrode 6 formed on the gate insulating layer 3, wherein the pixel electrode 6 is directly connected to the drain electrode 5; and
- an active layer 7 formed on the gate insulating layer 3, the source electrode 4 and the drain electrode 5.

For example, each of the source electrode 4 and the drain electrode 5 comprises at least two conductive layers.

For example, each of the source electrode 4 and the drain electrode 5 comprises a transparent electrode layer A and a metal layer B provided on the transparent electrode layer. The pixel electrode 6 and the transparent electrode layer A are formed integrally.

For example, the array substrate further comprises:
- a passivation layer 8 formed on the source electrode 4, the drain electrode 5 and the active layer 7, wherein a through hole 9 is formed in the passivation layer 8; and
- a data line 10 formed on the passivation layer 9, wherein the data line 10 is connected to the source electrode 4 via the through hole 9.

Alternatively, the data line 10 is provided in the same layer as the source electrode 4 and directly connected to the source electrode 4, and in this case, the passivation layer 8 formed on the source electrode 4, the drain electrode 5 and the active layer 7 as well as the through hole 9 may be omitted. However, it should be noted that, a short circuit may easily occur between the data line 10 and the pixel electrode 6 in the case that the data line 10 is provided in the same layer as the pixel electrode 6.

For example, the array substrate may further comprise an ohmic contact layer (not shown) formed between the source electrode 4 and the active layer 7 as well as between the drain electrode 5 and the active layer 7. The ohmic contact layer may be a doped layer (for example, an $N^+$ a-Si layer). The contact resistance between the source and drain electrodes and the active layer can be decreased by forming such ohmic contact layer, and thereby the properties of the TFT can be improved.

In the array substrate according to the embodiment of the invention, the pixel electrode is connected to the drain electrode directly, the through hole (if it is formed) for connecting the data line and the source electrode is provided in the region for the data line, thus the aperture ratio of the array substrate can be increased. Furthermore, in the array substrate according to the embodiment of the invention, the source and drain electrodes are provided on the same side of the active layer as the gate electrode, thus the source and drain electrodes are connected to the current passage C (only a portion of the current passage C is shown in the drawings) directly so that the properties (such as, conductivity and the like) of the TFT can be improved.

With reference to FIG. 5 to FIG. 8, a manufacturing method of an array substrate according to an embodiment of the invention comprises the following steps.

Figure 5:
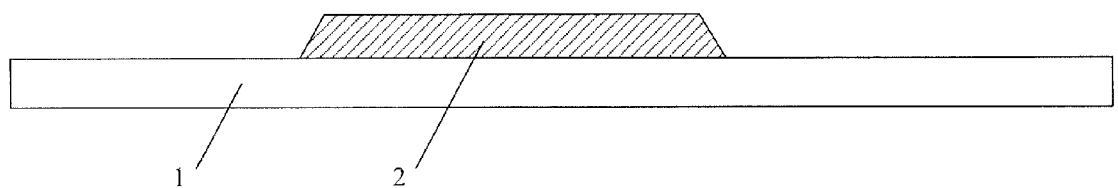
FIG. 5-FIG. 8 are schematic views illustrating a manufacturing method of an array substrate according to an embodiment of the invention.

Step S1, a gate line 11 and a gate electrode 2 are formed on a base substrate 1;

As shown in FIG. 5, a gate metal layer is deposited on the base substrate 1, and the gate line 11 and the gate electrode 2 are formed by performing a patterning process on the gate metal layer. The gate metal layer may be formed of Cr, Mo, Al, Cu, W, Nd or an alloy thereof.

Step S2, a gate insulating layer 3 is deposited after the Step S1, a conductive layer is formed on the gate insulating layer, and then a source electrode 4, a drain electrode 5 and a pixel electrode 6 are formed by performing a pattering process on the conductive layer.

For example, the conductive layer comprises at least two conductive layers that are formed on the gate insulating layer sequentially.

Figure 6:
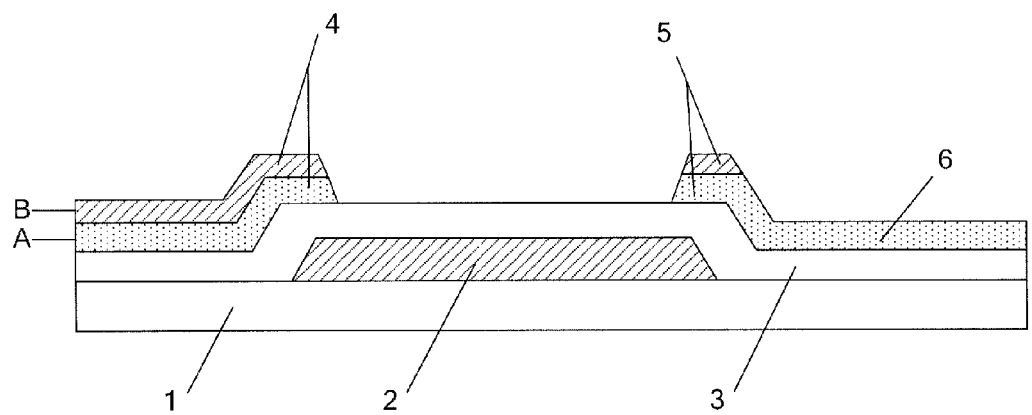

For example, the conductive layer comprises two conductive layers that are formed on the gate insulating layer sequentially. The two conductive layers are a transparent electrode layer A and a metal layer B provided on the transparent electrode layer A. In this case, the patterning process is performed on the transparent electrode layer A and the metal layer B to form the source electrode 4, the drain electrode 5 and the pixel electrode layer 6. The transparent electrode layer A may be made of a transparent conductive oxide, such as ITO or IZO. The metal layer B may be formed of Cr, Mo, Al, Cu, W, Nd or an alloy thereof. As shown in FIG. 6, each of the source electrode 4 and the drain electrode 5 comprises the transparent electrode layer A and the metal layer B, the pixel electrode 6 and the transparent electrode layer A are formed integrally so that the pixel electrode 6 is connected to the drain electrode 5 directly. As the stacked structure of the transparent electrode layer A and the metal layer B only exist in the TFT region and the pixel region is only provided with the transparent electrode layer A, thus the light transmission in the pixel region is not affected.

For example, the source electrode 4, the drain electrode 5 and the pixel electrode 6 may be formed by one patterning process with a half-tone mask or a gray-tone mask.

For example, the source electrode 4, the drain electrode 5 and the pixel electrode 6 may be formed by two patterning processes with normal masks.

Step S3, an active layer 7 is formed on the gate insulating layer 3, the source electrode 4 and the drain electrode 5.

Figure 7:
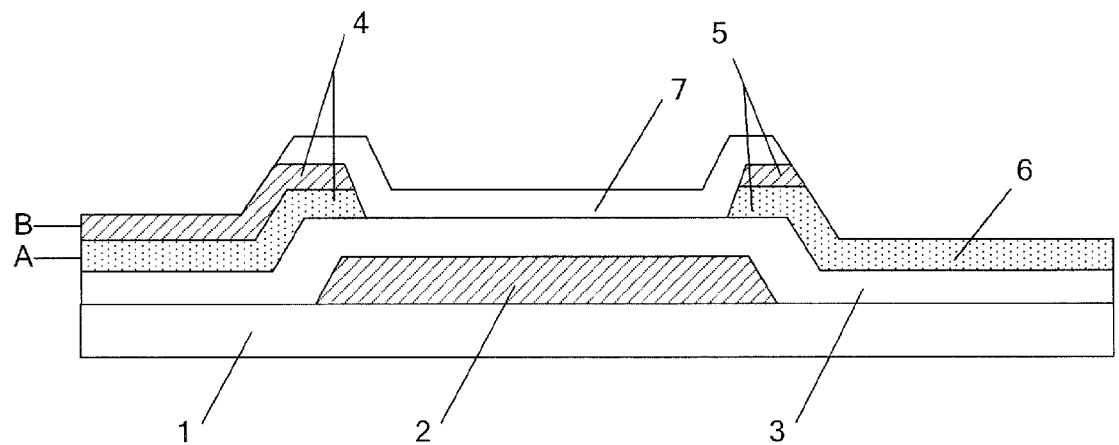

As shown in FIG. 7, a semiconductor layer is deposited after the Step S2, and the active layer 7 is formed by performing a patterning process on the semiconductor layer.

Figure 8:
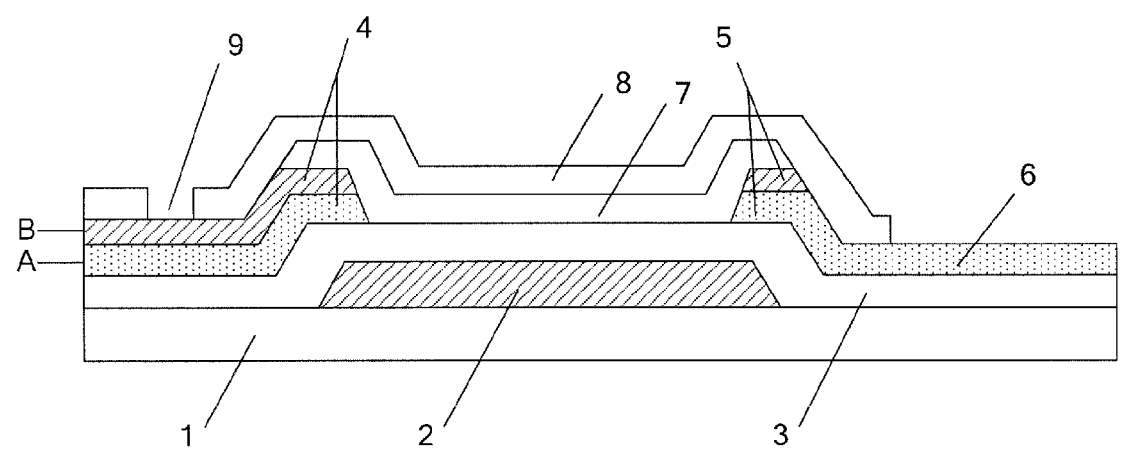

Step S4, a passivation layer 8 is formed on the source electrode 4, the drain electrode 5 and the active layer 7, and a through hole 9 is formed in the passivation layer 8 by performing a patterning process on the passivation layer 8;

As shown in FIG. 8, a passivation film is deposited after the Step S3, then the passivation film is patterned to remove the passivation film in the region other than the regions of the source electrode 4, the drain electrode 5 and the active layer 7 and in the region for forming the through hole, so that the passivation layer 8 and the through hole 9 are formed. The source electrode 4 is exposed by the through hole 9.

Step S5, a metal layer is deposited on the passivation layer 8, and then the metal layer is patterned to form a data line 10.

The data line 10 is connected to the source electrode 4 via the through hole 9 (as shown in FIG. 4).

Alternatively, the Step S4 and Step S5 may be omitted, and in this case, the data line and the source and drain electrodes may be formed simultaneously in Step S2 and the data line is connected to the source electrode directly. However, a short circuit may easily occur between the data line and the pixel electrode in the case that the data line is provided in the same layer as the pixel electrode.

As described above, each of the source and drain electrodes is formed by the stacked structure comprising the transparent electrode layer A and the metal layer B, the resistance of the stacked structure actually is the parallel resistance of the metal layer and the transparent electrode layer for forming the source and drain electrodes, and such parallel resistance is lower than the resistance of the source and drain electrodes merely formed by the metal layer B. Accordingly, the conductivity of the source can drain electrodes can be increased, and the properties of TFT can be improved.

In addition, an ohmic contact layer (for example, the ohmic contact layer is formed by a doped layer, such as an $N^+$ a-Si layer)) may be formed between the source electrode and the active layer as well as between the drain electrode and the active layer to decrease the contact resistance between the source and drain electrodes and the active layer. In this case, one additional patterning process should be employed.

According to an embodiment of the invention, a display device is further provided. The display device comprises any one of the above described array substrates.

The foregoing are only preferable embodiments of the invention. It is to be noted that, those with ordinary skills in the art may make various modifications and changes without departing the technical principle of the invention, and these modifications and changes should be deemed to be within the protection scope of the invention.

What is claimed is:

1. An array substrate, comprising:
   a base substrate;
   a gate line and a gate electrode formed on the base substrate;
   a gate insulating layer formed on the gate line and the gate electrode;
   a source electrode, a drain electrode and a pixel electrode formed on the gate insulating layer, wherein the pixel electrode is directly connected to the drain electrode; and
   an active layer formed on the gate insulating layer, the source electrode and the drain electrode;
   a passivation layer formed on the source electrode, the drain electrode and the active layer, wherein a through hole is formed in the passivation layer; and
   a data line formed on the passivation layer, wherein the data line extends perpendicular to the gate line and the data line is connected to the source electrode via the through hole.

2. The array substrate according to claim 1, wherein each of the source electrode and the drain electrode comprises at least two conductive layers.

3. The array substrate according to claim 2, wherein each of the source electrode and the drain electrode comprises a transparent electrode layer and a metal layer provided on the transparent electrode layer, the pixel electrode and the transparent electrode layer are formed integrally.

4. The array substrate according to claim 1, further comprising:
   an ohmic contact layer which is formed between the source electrode and the active layer as well as between the drain electrode and the active layer.

5. A display device, comprising an array substrate according to claim 1.

* * * * *